United States Patent [19]
Khatakhotan

[11] Patent Number: 5,079,614
[45] Date of Patent: Jan. 7, 1992

[54] GATE ARRAY ARCHITECTURE WITH BASIC CELL INTERLEAVED GATE ELECTRODES

[75] Inventor: Mehdy Khatakhotan, San Jose, Calif.

[73] Assignee: S-MOS Systems, Inc., San Jose, Calif.

[21] Appl. No.: 588,638

[22] Filed: Sep. 26, 1990

[51] Int. Cl.$^5$ .................. H01L 27/02; H01L 27/10; H01L 23/48
[52] U.S. Cl. .......................... 357/42; 357/45; 357/68
[58] Field of Search .................. 357/42, 45, 68

[56] References Cited

U.S. PATENT DOCUMENTS

| | | | |
|---|---|---|---|
| 4,668,972 | 5/1987 | Sato et al. | 357/42 |
| 4,682,201 | 7/1987 | Lipp | 357/42 |
| 4,884,115 | 11/1989 | Michel et al. | 357/42 |
| 4,884,118 | 11/1989 | Hui et al. | 357/45 |
| 4,949,157 | 8/1990 | Minami | 357/45 |
| 4,969,029 | 11/1990 | Ando et al. | 357/42 |

Primary Examiner—Rolf Hille
Assistant Examiner—Robert P. Limanek
Attorney, Agent, or Firm—W. Douglas Carothers, Jr.

[57] ABSTRACT

A interleaved channeless gate array architecture for fabricating very large scale integration circuits created in a gate array comprises a plurality of rows or columns of basic cells wherein each of the cells includes a pair arrangement of complementary channel MOS transistors formed in adjacently disposed different conductivity type diffusion regions. A gate electrode structure for the basic cells comprises a pair of comb-shaped gate electrodes each having a plurality of parallel spatially disposed legs. Gate electrode pairs are formed over each of the basic cells in opposite opposed relation with their legs alternately interleaved relative to each other. At least one pair of alternate interleaved legs is formed across each of the basic cell diffusion regions, and metal interconnects are formed across the basic cells in a direction perpendicular relative to direction of the formed interleaved legs, and are contacted to drain-/source areas of complementary channel MOS transistors and also to the gate electrode legs in gate array basic cells, as required, to form a designated circuit design.

14 Claims, 5 Drawing Sheets

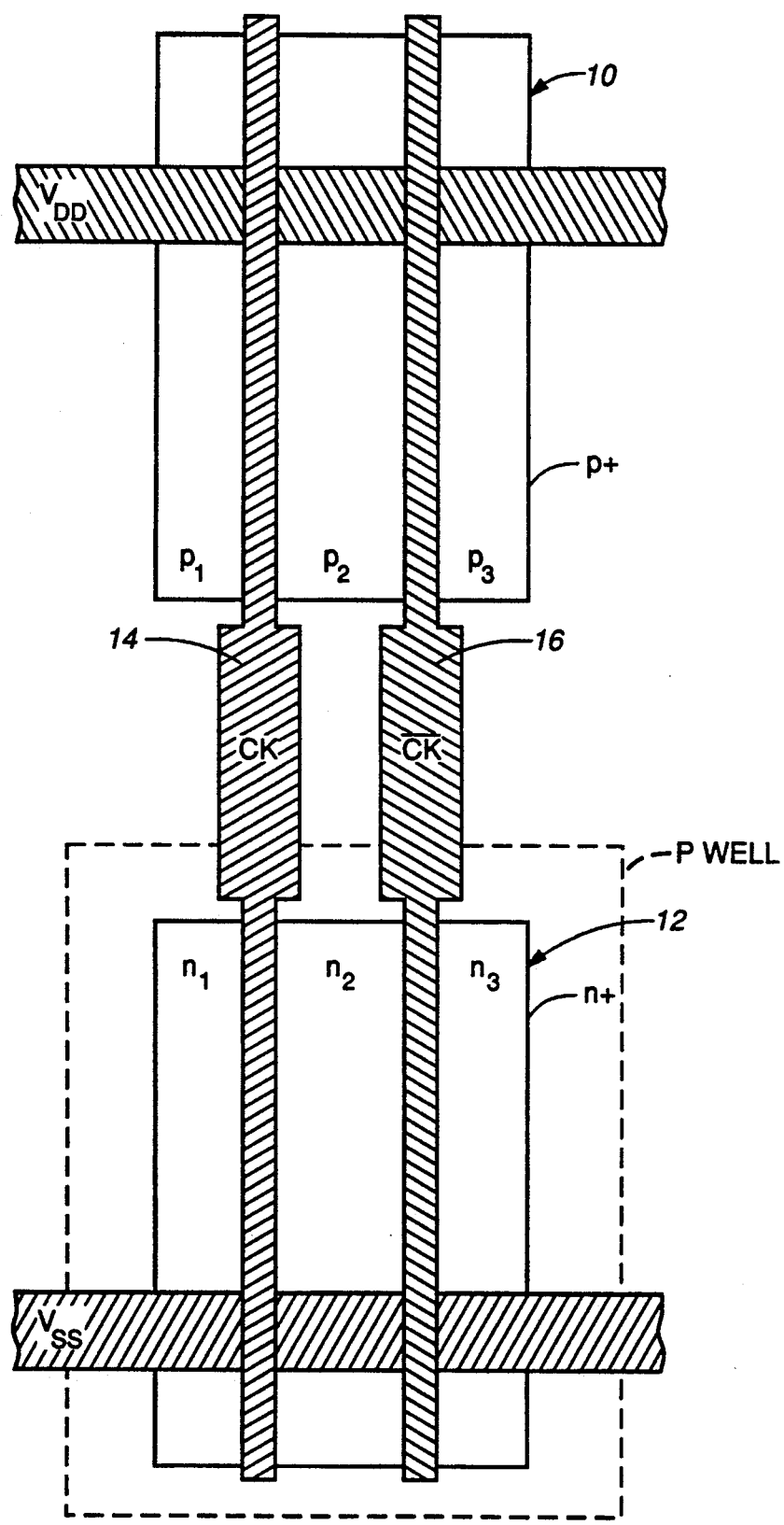
FIG._1
(PRIOR ART)

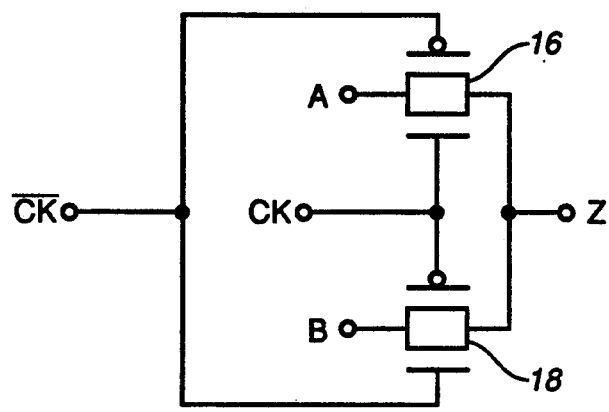
FIG._2
(PRIOR ART)
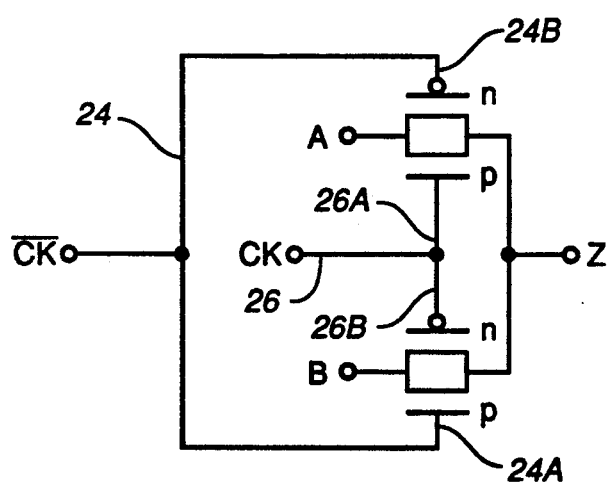
FIG._6

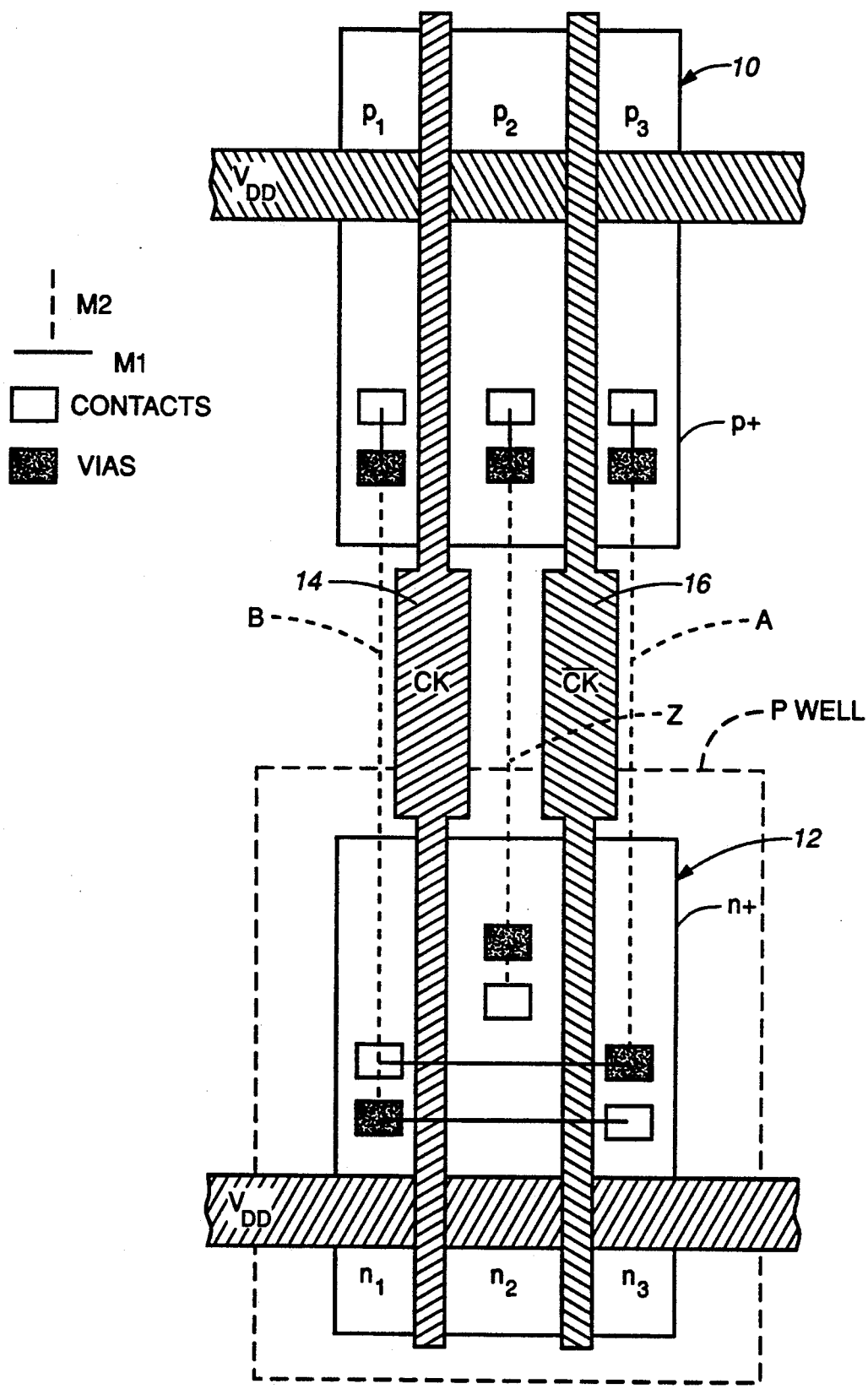
FIG._3
(PRIOR ART)

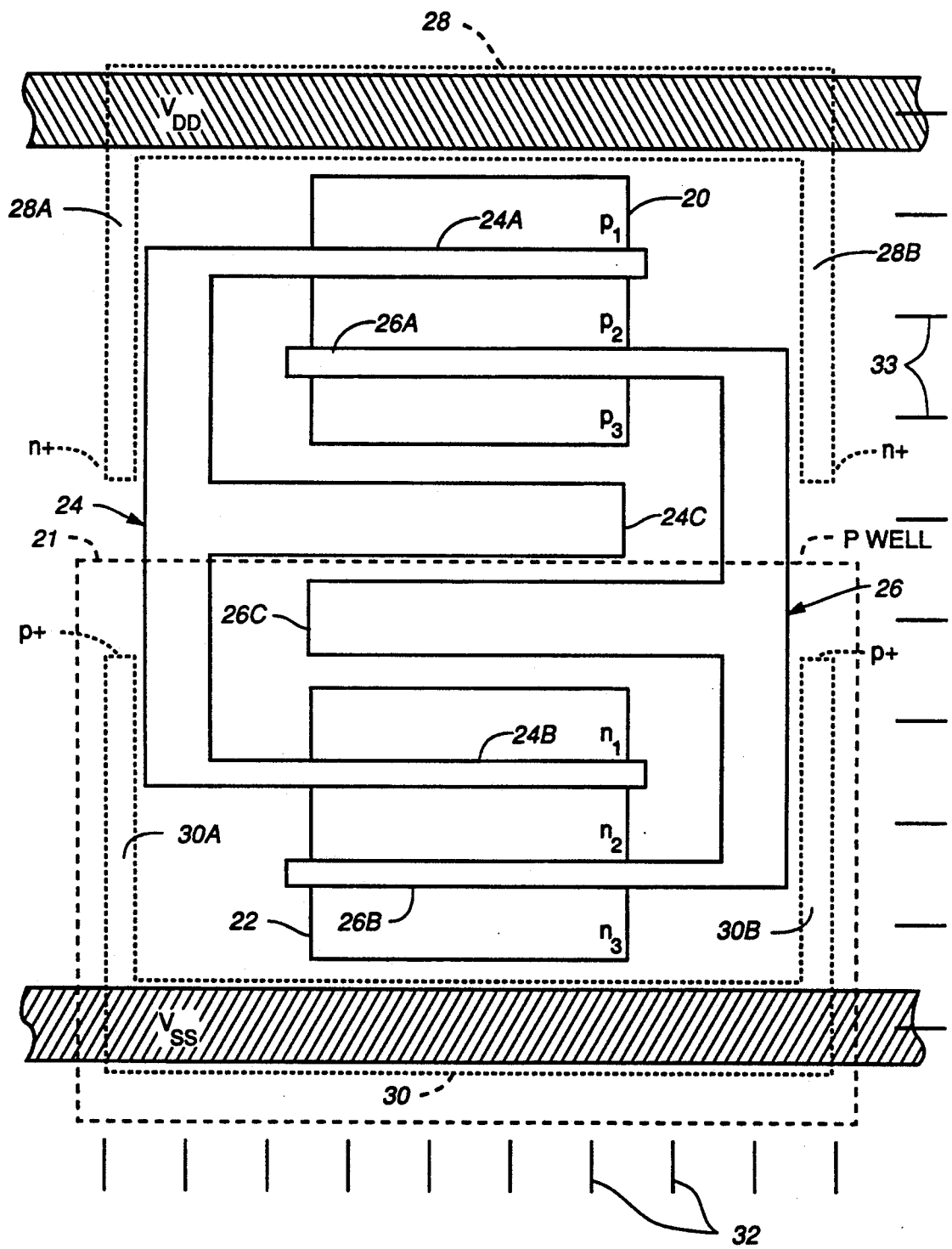
FIG._4

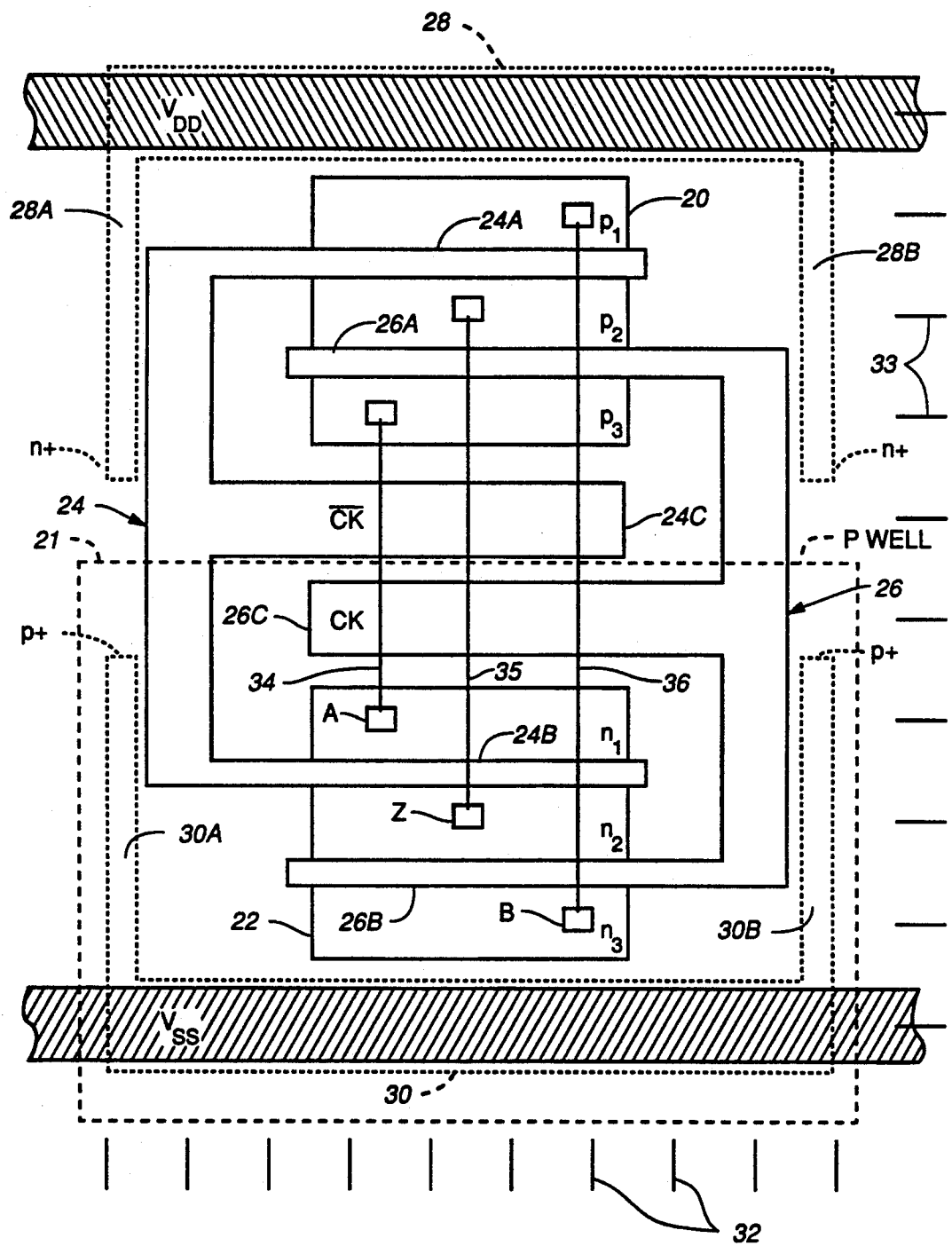
FIG._5

GATE ARRAY ARCHITECTURE WITH BASIC CELL INTERLEAVED GATE ELECTRODES

BACKGROUND OF THE INVENTION

This invention relates generally to gate array cell architecture and, more particularly, to CMOS gate array cell architecture for double metal CMOS processing that provides for straight line cell metal interconnects or metal interconnect paths in one metal level between cells for substantially most circuit designs and without the need for separate routing channels.

The core of a $M^2CMOS$ gate array comprises the placement of a multitude of gate array basic cells in orthogonal directions, such as, in consecutive rows and/or columns. The gate array basic cell per se is generally comprised of two or more n-channel and p-channel transistor pairs. A gate array macrocell comprises the interconnection of transistor pairs in one or more basic cells employing metal-1 or M-1 and metal-2 or M-2 interconnect layers. There is a preferred travel direction associated with each of these metal layers so that, for example, M-1 travels only in the vertical direction and M-2 travels only in the horizontal direction or vice versa.

A circuit design is fulfilled for a gate array by automatically placing the macrocells on possible basic cell sites and routing them together employing two metal interconnect layers. In conventional gate arrays, the amount of M-1 and M-2 employed in order to build macrocells generally completely covers the entire area of the basic cell thereby leaving no room for metal routing. As a result, in order to provide room for routing metals, one approach is to provide an area adjacent to the basic cells which is void of any basic cells. This void area is referred to in the art as a routing channel and a gate array constructed with such a channel is generally referred to as a channeled gate array. Another approach is to fill the entire array with basic cells, but leave alternate rows or columns of basic cells empty as they become needed for routing. Such as scheme is illustrated in U.S. Pat. No. 4,884,118. A still further approach is illustrated in U.S. Pat. No. 4,682,201 wherein a lateral shift relative to complementary transistor pairs of gate array basic cells is provided so that matched source/drain interconnects can be accomplished with straight line connections as illustrated in FIG. 5 of that patent. However, in many cases such a lateral shift in complementary transistor pairs results in a lost complement transistor pair in each basic cell. This is illustrated in the connected circuit device of FIG. 5 of U.S. Pat. No. 4,682,201 wherein the p region to the extreme right and the n region to the extreme left of connected macrocell remain unconnected and not able to be placed into use. Therefore, these areas throughout the array are wasted, particularly in the case of circuit designs utilizing complementary transistor pairs.

As a specific example of the foregoing, gate array basic cells generally comprise two or more n-channel and p-channel transistor pairs, such as, illustrated in FIG. 1. FIG. 1 depicts the physical layout of a typical four transistor gate array basic cell comprising two transistor pairs. The source/drain of p-channel transistors 10 are labelled $p_1$, $p_2$ and $p_3$ and the source/drain of n-channel transistors 12 are labelled $n_1$, $n_2$ and $n_3$. Polysilicon lines 14 and 16 form the gate electrode structure for the four transistors 10 and 12. When considering that formed metal tracks for the metal interconnects run in orthogonal directions vertically and horizontally, it is readily clear that there is no possibility for a straight line interconnect between cells that will cross all source and drain areas of both p and n-channel transistors 10 and 12 and their gates. As an example, in FIG. 1, in order to connect regions $p_1$, $p_3$ and $n_3$ to form a circuit structure, it is not possible to employ a single straight line interconnect and, therefore two layers of metal at different levels are necessary to accomplish such a connection.

FIG. 2 illustrates a schematic diagram of a conventional transistor circuit device comprising a CMOS transmission gate pair, which is often employed in gate array macrocells. In this circuit, A and B are input signals to transmission gates 16 and 18 which are complementary pairs of CMOS transistors. The output of gates 16 and 18 are connected to output Z. CK and $\overline{CK}$ are controlled or clock inputs to drive the gates of the complementary transistor pairs comprising transmission gates 16 and 18 and are determinative of whether either input signal A or input signal B is provided at output Z.

FIG. 3 is a physical layout of the transistor circuit device of FIG. 2 based on the conventional basic cell of FIG. 1 provided with an interconnect pattern for the transistor circuit device of FIG. 2. The metal interconnects require two different levels of metal because there is a necessary change in direction of the metal interconnects to complete the circuit unless one goes outside the basic cell which is not a viable solution because of possible interference with circuitry in an adjacent basic cell. Thus, FIG. 3 illustrates the complexity of interconnections for forming this circuit device in conventional gate arrays. In this example, the direction of the first metal layer, M1, is horizontal and the direction of the second metal layer, M2 is vertical. As can be seen from FIG. 3, the result is that the entire area of the basic cell of FIG. 1 is substantially taken up by the necessary placement of the cell metal interconnects.

It is an object of this invention to provide a new basic cell layout that substantially simplifies the metal interconnects employed in connection with gate array basic cells.

It is another object of this invention to provide for substantially all interconnects to be adapted to run or be placed in a single metal interconnect travel direction.

It is another object of this invention to minimize the amount of metal interconnects necessary to create gate array macrocells.

It is another object of this invention to maximize the porosity of gate array macrocells for routing.

It is a still further object of this invention to eliminate the need for separate routing channels adjacent to macrocell areas employed in conventional gate cell array architecture.

It is a further object of this invention to provide for higher utilization rates over conventional basic cell architectures.

SUMMARY OF THE INVENTION

According to this invention, a new basic cell layout employes an interleaved channeless gate array architecture for fabricating very large scale integration circuits created in a gate array that simplifies and minimizes the cell interconnect pattern while leaving ample routing resources without the need for channels or leaving whole rows or columns of transistor portions open or unavailable for use.

The interleaved channeless gate array architecture of this invention comprises a plurality of rows or columns of basic cells wherein each of the cells includes a pair arrangement of complementary channel MOS transistors formed in adjacently disposed different conductivity type diffusion regions. A gate electrode structure for the basic cells comprises a pair of comb-shaped gate electrodes each having a plurality of parallel spatially disposed legs. Gate electrode pairs are formed over each of the basic cells in opposite opposed relation with their legs alternately interleaved relative to each other. At least one pair of alternate interleaved legs is formed across each of the basic cell diffusion regions, and metal interconnects are formed across the basic cells in a direction perpendicular relative to direction of the formed interleaved legs, and are contacted to complementary channel MOS transistors and also to the gate electrode legs in gate array basic cells, as required, to form a designated circuit design.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a plane view of a conventional physical layout of a typical gate array basic cell.

FIG. 2 is an electrical schematic of a transistor circuit device comprising a CMOS transmission gate pair.

FIG. 3 is a plane view of the conventional physical layout of the gate array basic cell design for the circuit device shown in FIG. 2.

FIG. 4 is a plane view of the physical layout of the gate array basic cell architecture comprising this invention.

FIG. 5 is a plane view of the physical layout of the gate array basic cell architecture of this invention for the circuit device shown in FIG. 2.

FIG. 6 is the circuit device of FIG. 2 illustrating gate and interconnect correspondence with the layout of FIG. 5.

DESCRIPTION OF THE PREFERRED EMBODIMENTS

Reference is now made to FIG. 4 wherein there is shown the physical layout of the new gate array basic cell architecture comprising this invention. FIG. 4 illustrates one gate array basic cell comprising, for example, a p+ diffusion region 20 and a n+ diffusion region 22 from which can be built or created two or more p-channel and n-channel transistor pairs via the regions labeled $p_1$, $p_2$ and $p_3$ in p+ diffusion region 20 of a n-silicon substrate and the regions labeled $n_1$, $n_2$ and $n_3$ in n+ diffusion region 22. In the architecture of this invention compared to conventional architecture, diffusion regions 20 and 22 are slightly wider in the horizontal or row direction and gate electrode structures 24 and 26 of polysilicon are not formed vertically or in the column direction but rather horizontally in the row direction with extended regions of their structures crossing over diffusion regions 20 and 22. More importantly, gate electrode structures each have multiple leg groups 24A, 24B & 24C, and 26A, 26B & 26C. Further, multiple legs 24A, 24B & 24C of gate electrode structure 24 are interleaved with multiple legs 26A, 26B & 26C of gate electrode structure 26. As a result, at least one pair of spatially disposed legs 24A, 26A of each gate electrode structure 24, 26 are parallel and are formed to longitudinally cross one diffusion region 20. Likewise, at least one pair of spatially disposed legs 24B, 26B of each gate electrode structure 24, 26 are parallel and are formed to longitudinally cross the other diffusion region 22. Central legs 24C, 26C of gate structures 24, 26 are spatially disposed between diffusion regions 20 and 22 of the basic cell. Legs 24C, 26C are regions wherein the metal interconnects may be connected to either polysilicon gate electrode structure 24, 26.

Thus, gate electrode structures 24, 26 comprise comb-shaped gate electrodes having multiple parallel legs 24A-C, 26A-C that are alternately interleaved relative to each other, all run or travel in the horizontal or row direction, and run in opposite directions to form pairs 24A, 26A and 24B, 26B over the longitudinal extent of respective p-type and n-type diffusion regions 20 and 22. In other words, the comb-shaped electrodes 24, 26 are arranged in oppositely opposed relation to each other with their legs alternately interleaved with each other. Further, respective gate pairs 24A, 26A and 24B, 26B define p-channel transistors relative to regions labeled $p_1$, $p_2$ and $p_3$ and n-channel transistors relative to regions labeled $n_1$, $n_2$ and $n_3$.

The gate array basic cell of FIG. 4 is completed with metal-2, M2, running or traveling horizontally for the VDD power and VSS ground or reference lines, and the respective n+ diffusion regions 28, 28A, 28B and p+ diffusion regions 30, 30A, 30B that provide for electrical contact to the substrate as well as cell isolation to eliminate latchup.

The series of vertical lines 32 at the bottom of FIG. 4 and the series of horizontal lines at the right edge of FIG. 4 represent an example of the number of possible metal routing tracks that may be formed in orthogonal directions relative to the gate array basic cell. The basic cell architecture of this invention comparatively provides for slightly larger cells over conventional architecture but employs less interconnects to form the circuit connections in both interconnect layers with greater permeability, i.e., greater choice of metal tracks for routing and cell interconnects as represented by lines 32 and 33.

An important feature resulting from this invention is that interconnects may be formed along any track 32 and are all in a single metal travel direction for accommodating almost any type of circuit design or configuration. Since source/drain areas and gate areas run parallel with each other, a single straight line can cross all n-type and p-type source/drain regions $n_1$, $n_2$ and $n_3$ and $p_1$, $p_2$ and $p_3$ of a basic cell as well as all as legs and gates 24A-C, 26A-C of polysilicon gate electrode structures 24, 26 of a basic cell. As a result, any arrangement of source, drain or polysilicon gate in an aligned column of complementary diffusion regions of the gate array can be connected to any other arrangement of source, drain or polysilicon gate of the same column employing a single straight line metal interconnect. For example, the example given in the Background of the Invention relative to FIG. 1 was indicated as a connection of areas marked $p_1$, $p_3$ and $n_3$. It can be seen that a connection of those same areas $p_1$, $p_3$ and $n_3$ in FIG. 4 can be accomplished with a single straight line interconnect along one of several tracks 32. The cell arrangement and interleaved polysilicon gate electrode structure of FIG. 4, therefore, simplifies and greatly reduces the required cell interconnect pattern for forming gate array macrocells thereby maximizing routing resources while reducing costs because of smaller die size and reduced interconnect line size and lengths and, therefore, reduced capacitance with corresponding increase in circuit speed operation.

It will be realized by those skilled in the art that the interleaved gate electrode structures 24, 26 shown in FIG. 4 is just one configuration illustrating the basic principal of this invention. For example, gate electrode structures 24, 26 could employ additional leg pairs to cross p+ and n+ diffusion regions of greater width with individual legs of each pair traveling in opposite directions. Also, even though the configuration is shown for interconnects to run vertical with gate electrode structures running horizontal, it is clear to those skilled in the art that these orthogonal directions can be reversed.

FIG. 5 illustrates the plane view of the physical layout of the gate array basic cell architecture of this invention, as discussed in FIG. 4 and implemented for the circuit device shown in FIG. 2. The metal-1, M1, interconnects 34, 35 and 36 illustrate the simplicity of the interconnect pattern relative to the gate array basic cell employing the architecture of this invention. As illustrated, there is no requirement for a change in metal direction. Also, there is significant room left to route through the cell via other tracks 32 thereby eliminating the need for separate routing channels adjacent to rows or columns of basic cells. Also, all metal-2, M2, tracks 33 are open and available for routing except those taken up by the lines of VDD and VSS. Thus, substantially all the cell interconnections can be accomplished in metal-1, M1. Metal-2, M2, is in the other orthogonal direction and thicker and bigger pitch to accommodate the needs for source, VDD, and ground or reference, VSS. The same straight line interconnection of designated transistor pairs is also achieved for many other types of gate array devices so that FIG. 5 represents only a single example of the implementation of this invention.

FIG. 6 shows the electrical schematic diagram for the connected basic cell of FIG. 5 relative to correspondence of diffusion regions $p_1-p_3$ and $n_1-n_3$ relative gate electrode structures 24, 26 and the two complementary transistor pairs.

The advantages of this invention utilizing the new gate array architecture shown in FIGS. 4 and 5, which has been implemented in 0.8 μm integration scale, are as follows. First, the architecture of this invention minimizes the amount of interconnect metal required to create gate array macrocells because of the simplified interconnected pattern with the travel direction for the interconnects accomplished in a single direction. By having interconnects designed to all run or travel in one direction, the result interconnect pattern throughout the gate array is greatly simplified without need for metal direction changes. Single direction routing of interconnects in M1 due to the interconnect gate electrode structures provides an almost unlimited capability of connecting different areas of diffused source/drain regions of the same or different aligned basic cells to form different kinds of transistor and transistor pair patterns without any requirement for changing the direction of M1 interconnects. The foregoing, however, is not meant to be a limitation on the change of direction of interconnect metal, as for a particular application, a change in metal direction can be accomplished via M2.

Secondly, the architecture of this invention maximizes gate array macrocell porosity for interconnect routing via both metal layers. Since the number of interconnects throughout the basic cell are minimized, there is a corresponding increase in the amount of parallel interconnect tracks through the basic cell for macrocell connection and interconnection in the gate array. Thus, the possibilities of different routing through the basic cells of the gate array are maximized thereby making it easier for the router or the routing process.

Third, the architecture of this invention allocates substantial balance of routing resources in both horizontal and vertical directions. This means that there is an even number of potential metal routing tracks throughout the gate array, i.e., before automated interconnect routing but after cell interconnects and power/ground interconnects have been made. This balance is because power distribution is done primarily using M2 and cell interconnect is done primarily using M1.

Fourth, the architecture of this invention eliminates the need for routing channels or channel deployment adjacent to aligned gate array basic cells and permits previous channel areas to be employed for basic cell utilization.

Fifth, the architecture of this invention achieves very high utilization rates for VLSI devices. Prior art approaches of the type previously discussed have utilization rates in the region of 50% of chip real estate. The architecture of this invention provides for utilization rates of over 90%. The utilization rate, of course, depends upon the employment of complement transistor pairs. There are circuit designs, such as, inverters, that do not use available transistor pairs and, as a result, the utilization rate, of course, will not be as high.

Sixth, the architecture of this invention permits reduced area per usable gate in the gate array. While the basic cell size is larger than conventional gate array cell sizes, greater utilization rates are achieved due to the interleaved gate electrode structure and simplified cell interconnect pattern. As a result, there is a net reduction in area per useable gate.

Seventh, the architecture of this invention permits a reduction in die size with a corresponding reduction in cost and improved device performance. The reduction in costs is brought about by smaller dies for circuit design implementation with corresponding reduction in metal line lengths. This will result in smaller scale circuit designs with less capacitance and a corresponding increase in circuit operational speed.

While the invention has been described in conjunction with several specific embodiments, it is evident to those skilled in the art that many further alternatives, modifications and variations will be apparent in light of the forgoing description. Thus, the invention described herein is intended to embrace at such alternatives, modifications, applications and variations as fall within the spirit and scope of the appended claims.

What is claimed is:

1. A gate array architecture comprising a two dimensional array of basic cells formed in a matrix each of the same construction and having pair arrangements of complementary transistors comprising spaced complementary diffusion regions aligned in a first direction, a pair of gate electrode structures for each basic cell formed over said diffusion regions with each structure having a plurality of furcated legs extending in parallel over the cell in a direction substantially orthogonal relative to said first direction, the furcated legs of one gate electrode structure being alternately interleaved with the furcated legs of the other gate electrode structure, at least one pair of spatially disposed furcated legs from both of said gate electrode structures being formed laterally across said diffusion regions in said second direction.

2. The gate array architecture of claim 1 wherein one of said spatially disposed furcated legs in both of said gate electrode structures formed between said complementary diffusion regions of said basic cells.

3. A very large scale integration circuit created in a standard gate array comprising a plurality of identical rows or columns of basic cells formed in a matrix wherein each of said cells includes a pair arrangement of complementary channel MOS transistors formed in adjacently disposed different conductivity type diffusion regions, said adjacently disposed diffusion regions aligned in a first direction, a gate electrode structure for said basic cells comprising a pair of comb-shaped gate electrodes each having a plurality of parallel spaced legs, the gate electrode legs of each of said comb-shaped gate electrode pair formed over each of said basic cells in opposite opposed relation with their legs alternately interleaved relative to each other in a second direction substantially orthogonal to said first direction, at least one pair of alternate interleaved legs formed across each of said basic cell diffusion regions, metal interconnects formed across said basic cells in said first direction substantially perpendicular to said second direction of said interleaved legs and contacted to any selected of said complementary channel MOS transistors and said gate electrode legs are required to form said circuit.

4. The gate array architecture of claim 3 wherein one of said spatially disposed furcated legs in both of said gate electrode structures formed between said different conductivity type diffusion regions of said basic cells.

5. A gate array architecture comprising a plurality of basic cells arranged in aligned columns and rows, each of said cells having at least one pair arrangement of complementary transistors comprising spaced opposite conductivity diffusion regions defining source/drain regions wherein said diffusion regions are aligned in a first orthogonal direction, and gate electrode regions with gate electrode means comprising a plurality of spatially disposed electrode legs formed over said diffusion regions in a second orthogonal direction wherein any one source/drain or gate electrode region of a basic cell can be connected to any other source/drain and gate electrode regions of the same basic cell or to a source/drain or gate electrode region of any basic cell in the same cell column exclusively with straight line interconnections extending in said first orthogonal direction.

6. The gate array architecture of claim 5 wherein said gate electrode means comprises a pair of comb-shaped gate electrodes formed oppositely opposed to each other and each having a plurality of parallel spatially disposed, connected legs with their respective legs alternately interleaved relative to each other.

7. A gate array architecture comprising a two dimensional matrix of orthogonally aligned basic cells, each of said basic cells having at least one pair of spatially disposed complementary diffusion regions wherein said pairs are aligned in one orthogonal direction of said matrix, gate electrode means for said basic cells comprising at least one pair of connected and spatially separated electrode legs with each pair leg traversing over one of said complementary diffusion regions in a direction substantially perpendicular to said one orthogonal direction forming complement source/drain regions relative to said complementary diffusion regions whereby exclusive straight line interconnections are possible for all possible combinations of connection of any of said complement source/drain regions in both of said complementary diffusion regions in said basic cells and for basic cells aligned in said one orthogonal direction.

8. The gate array architecture of claim 7 wherein power and reference lines extend over said basic cells in a direction parallel to said electrode legs.

9. The gate array architecture of claim 7 wherein said gate electrode means includes an additional electrode leg formed in parallel between said pair electrode legs and over a region between said complementary diffusion regions in a direction substantially perpendicular to said one orthogonal direction whereby exclusive straight line interconnections are possible for all possible combinations of connection of any of said complement source/drain regions in both of said complementary diffusion regions and said additional electrode leg in said basic cells in said one orthogonal direction.

10. The gate array architecture of claim 9 wherein power and reference lines extend over said basic cells in a direction parallel to said electrode legs.

11. A gate array architecture comprising a two dimensional matrix of orthogonally aligned basic cells, each of said basic cells having at least one pair of spatially disposed complementary diffusion regions wherein said pairs are aligned in one direction of said matrix, gate electrode means comprising a pair of comb-shaped gate electrodes formed oppositely opposed to each other and each having a plurality of parallel and spatially disposed legs with their legs alternately interleaved relative to each other and with each leg of said comb-shaped gate electrode pair traversing over one of said complementary diffusion regions in a direction transverse to said one direction forming complement source/drain regions relative to said complementary diffusion regions, the transverse directional nature of said gate electrodes relative to said one direction being sufficiently large to permit straight line interconnections for all possible combinations of connection of any of said complement source/drain regions in both of said complementary diffusion regions in said basic cells and for basic cells aligned in said one orthogonal direction.

12. The gate array architecture of claim 11 wherein power and reference lines extend over said basic cells in a direction parallel to said electrode legs.

13. The gate array architecture of claim 11 wherein each of said comb-shaped gate electrodes include an additional electrode leg formed in parallel between said electrode legs over a region between said complementary diffusion regions in a direction transverse to said one orthogonal direction whereby exclusive straight line interconnections are possible for all possible combinations of connection of any of said complement source/drain regions in both of said complementary diffusion regions and said additional electrode leg in said basic cells in said one orthogonal direction.

14. The gate array architecture of claim 13 wherein power and reference lines extend over said basic cells in a direction parallel to said electrode legs.

* * * * *